(12) United States Patent
Lu et al.

(10) Patent No.: US 11,574,796 B1
(45) Date of Patent: Feb. 7, 2023

(54) DUAL XY VARIABLE APERTURE IN AN ION IMPLANTATION SYSTEM

(71) Applicant: Applied Materials, Inc., Santa Clara, CA (US)

(72) Inventors: Jun Lu, Beverly, MA (US); Frank Sinclair, Boston, MA (US); Shane W. Conley, Gloucester, MA (US); Michael Honan, Danvers, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/382,041

(22) Filed: Jul. 21, 2021

(51) Int. Cl.
| | |
|---|---|
| H01J 37/00 | (2006.01) |
| H01J 37/30 | (2006.01) |
| H01J 37/02 | (2006.01) |
| H01J 37/317 | (2006.01) |

(52) U.S. Cl.
CPC ........ *H01J 37/3007* (2013.01); *H01J 37/023* (2013.01); *H01J 37/3171* (2013.01)

(58) Field of Classification Search
CPC ... H01J 37/3007; H01J 37/023; H01J 37/3171
USPC ........................................... 250/492.1–492.3
See application file for complete search history.

(56) References Cited

U.S. PATENT DOCUMENTS

| | | | |
|---|---|---|---|
| 4,757,208 A | | 7/1988 | McKenna et al. |
| 4,943,728 A | * | 7/1990 | Dykstra .............. H01J 37/3171 250/492.3 |
| 5,130,552 A | | 7/1992 | Bright et al. |
| 5,629,528 A | * | 5/1997 | Jost .......................... H01J 37/09 250/492.21 |
| 7,227,160 B1 | | 6/2007 | Vanderberg et al. |
| 8,637,838 B2 | | 1/2014 | Eisner et al. |
| 9,496,117 B2 | | 11/2016 | Schaller et al. |
| 9,953,801 B1 | * | 4/2018 | Cristoforo ............... H01J 37/09 |
| 11,049,691 B2 | | 6/2021 | Koo et al. |

(Continued)

FOREIGN PATENT DOCUMENTS

| | | |
|---|---|---|
| CN | 105247660 A | 1/2016 |
| EP | 0785567 A2 | 7/1997 |

(Continued)

OTHER PUBLICATIONS

International Search Report and Written Opinion dated Feb. 13, 2019 in co-pending PCT application No. PCT/US2018/057287.

(Continued)

*Primary Examiner* — Michael Maskell
(74) *Attorney, Agent, or Firm* — Nields, Lemack & Frame, LLC (57) ABSTRACT

An aperture diaphragm capable of varying the size of an aperture in two dimensions is disclosed. The aperture diaphragm may be utilized in an ion implantation system, such as between the mass analyzer and the acceleration column. In this way, the aperture diaphragm may be used to control at least one parameter of the ion beam. These parameters may include angular spread in the height direction, angular spread in the width direction, beam current or cross-sectional area. Various embodiments of the aperture diaphragm are shown. In certain embodiments, the size of the aperture in the height and width directions may be independently controlled, while in other embodiments, the ratio between height and width is constant.

19 Claims, 6 Drawing Sheets

(56) References Cited

U.S. PATENT DOCUMENTS

| | | |
|---|---|---|
| 11,069,511 B2 | 7/2021 | Hatem et al. |
| 2002/0043621 A1 | 4/2002 | Aitken |
| 2005/0218345 A1* | 10/2005 | Shibata .............. H01J 37/3171 |
| | | 250/492.21 |
| 2006/0267001 A1 | 11/2006 | Hung |
| 2006/0289798 A1 | 12/2006 | Cummings et al. |
| 2007/0164237 A1 | 7/2007 | Bernhardt |
| 2009/0179161 A1 | 7/2009 | Ward et al. |
| 2009/0321632 A1 | 12/2009 | Grant et al. |
| 2012/0298854 A1 | 11/2012 | Hamby et al. |
| 2014/0261173 A1* | 9/2014 | Lane ....................... H01J 37/08 |
| | | 118/712 |
| 2015/0206701 A1 | 7/2015 | Schaller et al. |
| 2016/0189917 A1 | 6/2016 | Vanderberg et al. |
| 2019/0198292 A1 | 6/2019 | Koo et al. |

FOREIGN PATENT DOCUMENTS

| | | |
|---|---|---|
| JP | 8-111203 A | 4/1996 |
| JP | 2019-96477 A | 6/2019 |
| KR | 10-2015-0130557 A | 11/2015 |
| TW | 200739648 A | 10/2007 |

OTHER PUBLICATIONS

International Search Report and Written Opinion dated Nov. 2, 2022 in corresponding PCT application No. PCT/US2022/036352.

\* cited by examiner

DUAL XY VARIABLE APERTURE IN AN ION IMPLANTATION SYSTEM

FIELD

This disclosure describes a device that creates an aperture that is variable in two directions, and more particularly a device for use in an ion implantation system.

BACKGROUND

Semiconductor devices are fabricated using ion implantation systems. These systems create an ion beam by ionizing a feedgas using an ion source. The ionized feedgas is extracted from the ion source. The ion beam is then manipulated as it travels from the ion source to the workpiece. For example, the ion beam may be accelerated, collimated, scanned or otherwise modified along its path.

In certain embodiments, it may be desirable to utilize different beam currents to fabricate a semiconductor device. This is typically achieved by varying the parameters of the ion source. However, this process may be time consuming, reducing throughput and lowering efficiency.

Further, in some embodiments, it may be beneficial to control the horizontal and/or vertical angular spread of the ion beam.

In still other embodiments, it may be advantageous to control the dimensions of the ion beam such that it may pass through an electrode or other component.

Therefore, it would be beneficial if there were an apparatus that could be introduced into the beam line to achieve these different objectives. Further, it would be advantageous if this apparatus was applicable to a variety of different types of ion implantation systems.

SUMMARY

An aperture diaphragm capable of varying the size of an aperture in two dimensions is disclosed. The aperture diaphragm may be utilized in an ion implantation system, such as between the mass analyzer and the acceleration column. In this way, the aperture diaphragm may be used to control at least one parameter of the ion beam. These parameters may include angular spread in the height direction, angular spread in the width direction, beam current or cross-sectional area. Various embodiments of the aperture diaphragm are shown. In certain embodiments, the size of the aperture in the height and width directions may be independently controlled, while in other embodiments, the ratio between height and width is constant.

According to one embodiment, an ion implantation system is disclosed. The ion implantation system comprises an ion source to generate an ion beam; a mass analyzer; a mass resolving device; an acceleration column to accelerate the ion beam toward a workpiece; a platen; and an aperture diaphragm, disposed between the mass resolving device and the acceleration column, wherein the aperture diaphragm is configured to vary a size of an aperture in two dimensions. In certain embodiments, the acceleration column comprises a linear accelerator. In some embodiments, the acceleration column comprises an acceleration/deceleration stage, and the ion implantation system further comprises a collimator disposed upstream from the acceleration/deceleration stage. In some embodiments, the aperture diaphragm comprises two aperture mechanisms, wherein each aperture mechanism comprises two panels disposed on a guide rail, wherein the two panels are controlled by an actuator. In certain embodiments, the two aperture mechanisms are offset by 90°. In certain embodiments, the two aperture mechanisms are independently controlled. In some embodiments, the aperture diaphragm comprises an aperture mechanism, comprising two panels disposed on a guide rail, wherein an interior edge of each panel has an indent that comprises two sloped lines, wherein the two sloped lines meet at a 90° angle. In some embodiments, the aperture diaphragm comprises an iris aperture.

According to another embodiment, an ion implantation system is disclosed. The ion implantation system comprises an ion source to generate an ion beam; a mass analyzer; an acceleration column to accelerate the ion beam toward a workpiece; a platen adapted to hold the workpiece; an aperture diaphragm, disposed between the mass analyzer and the acceleration column, wherein the aperture diaphragm is configured to change a size of an aperture in two dimensions; and a controller in communication with the aperture diaphragm to vary the size of the aperture so as to control at least one parameter of the ion beam. In some embodiments, the aperture diaphragm functions as a mass resolving device and also controls a height of the ion beam. In some embodiments, the at least one parameter comprises angular spread in a width direction, angular spread in a height direction, beam current and cross-sectional area of the ion beam. In some embodiments, the acceleration column comprises a linear accelerator, and wherein the linear accelerator comprises a plurality of accelerator electrodes, wherein the accelerator electrodes are ring shaped, and the controller varies a size of the aperture such that the cross-sectional area of the ion beam exiting the aperture diaphragm is less that an inner diameter of the accelerator electrodes. In some embodiments, the controller varies the size of the aperture so as to change the beam current that impacts the workpiece disposed on the platen. In certain embodiments, the ion implantation system comprises a mass resolving device disposed between the mass analyzer and the aperture diaphragm. In certain embodiments, the controller controls the size of the aperture to control angular spread in the width direction, and wherein the angular spread is determined based on the size of the aperture, the size of an opening in the mass resolving device, and a distance between the aperture diaphragm and the mass resolving device in a direction of the ion beam. In some embodiments, the aperture diaphragm comprises two aperture mechanisms, wherein each aperture mechanism comprises two panels disposed on a guide rail, wherein the two panels are controlled by an actuator. In certain embodiments, the controller controls the angular spread in the height direction independent of the angular spread in the width direction. In certain embodiments, the ion implantation system comprises a second aperture diaphragm, disposed between the mass analyzer and the aperture diaphragm, wherein the controller controls the apertures so as to control the angular spread in the height direction. In some embodiments, the aperture diaphragm comprises an aperture mechanism, comprising two panels disposed on a guide rail, wherein an interior edge of each panel has an indent that comprises two sloped lines, wherein the two sloped lines meet at a 90° angle. In some embodiments, the aperture diaphragm comprises an iris aperture.

BRIEF DESCRIPTION OF THE FIGURES

For a better understanding of the present disclosure, reference is made to the accompanying drawings, which are incorporated herein by reference and in which.

DETAILED DESCRIPTION

The present disclosure describes the use of a dual variable aperture that may be inserted into the beam path of an ion implantation system to control one or more parameters of the ion beam. These parameters include, but are not limited to, the ion beam shape, the ion beam current, and the angular spread of the ion beam.

The apparatus that creates the dual variable aperture allows the dimension of the beam to be controlled in two dimensions. In certain embodiments, the two dimensions may be the width direction, also referred to as the X direction, and the height direction, also referred to as the Y direction.

In certain embodiments, the width is the X direction may be controlled independently from the height in the Y direction. In other embodiments, the ratio of the height to the width (Y:X) remains constant as both directions are controlled with a single actuator.

A variety of devices may be used to create the dual variable aperture. These devices may be referred to as aperture diaphragms. The aperture diaphragm, as defined in this disclosure, is a device that may be used to control the size of an aperture in two dimensions. In certain embodiments, the two dimensions may be independently controlled, while in other embodiments, the two dimensions are varied so as to retain a fixed ratio between the height and width of the aperture.

Figure 1A:
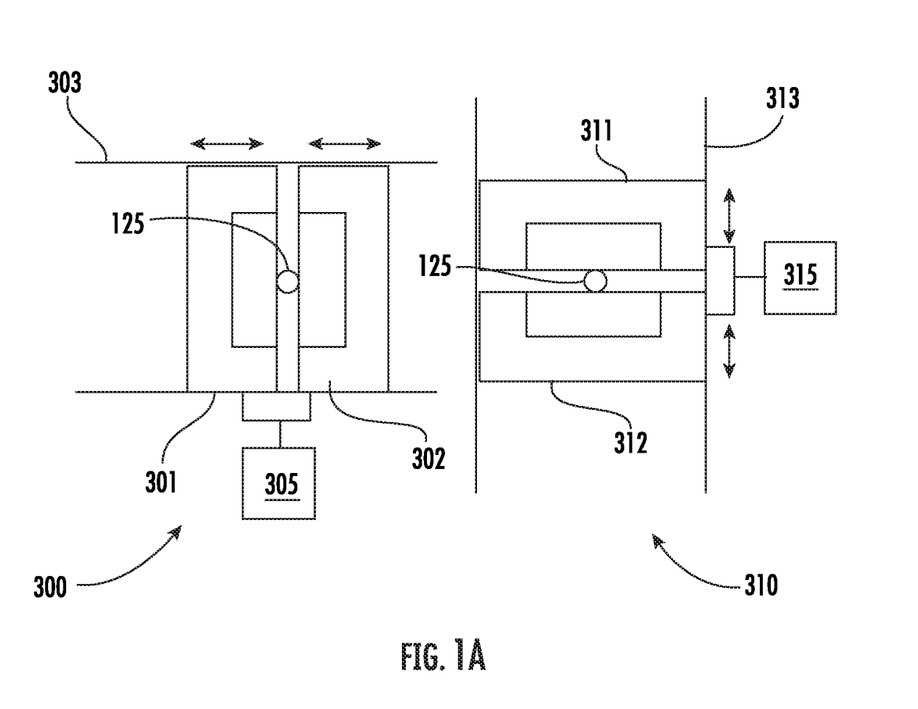
FIGS. 1A-1B show the aperture diaphragm according to one embodiment.
Figure 1B:
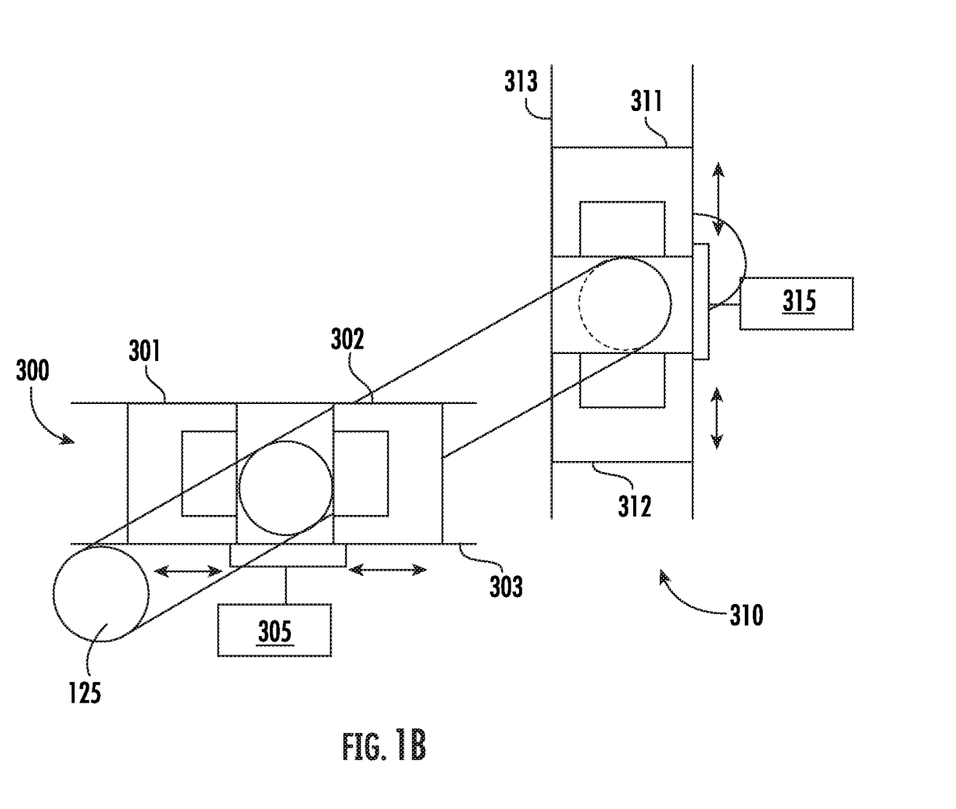

FIGS. 1A-1B show a first embodiment of an apparatus that may be used to create the dual variable aperture. In this embodiment, the aperture diaphragm comprises two separate aperture mechanisms that control the dimension of the aperture in two different directions. The first aperture mechanism 300, which may control the horizontal aperture, comprises a left panel 301 and a right panel 302. The left panel 301 and the right panel 302 may be disposed on a first guide system 303. The left panel 301 and the right panel 302 may be in communication with a horizontal actuator 305. The horizontal actuator 305 may be configured to translate the left panel 301 and the right panel 302 in opposite directions at the same rate. In this way, the center of the horizontal space between the two panels remains fixed. The horizontal actuator 305 may be a stepper motor or another type of motor.

The second aperture mechanism 310, which may control the vertical aperture, comprises an upper panel 311 and a lower panel 312. The upper panel 311 and the lower panel 312 may be disposed on a second guide system 313. The upper panel 311 and the lower panel 312 may be in communication with a vertical actuator 315. The vertical actuator 315 may be configured to translate the upper panel 311 and the lower panel 312 in opposite directions at the same rate. In this way, the center of the vertical space between the two panels remains fixed. The vertical actuator 315 may be a stepper motor or another type of motor.

While FIG. 1A shows the two aperture mechanisms positioned next to one another, it is understood that these two aperture mechanisms are positioned adjacent in the Z direction, where the Z direction is the direction of the ion beam 125.

The panels may be constructed from graphite or another suitable material. The dimensions of the panels may be 2"×4", although other dimensions may also be used so long as, in the closed position, the panels are larger than the largest beam anticipated so as to block the entirety of the ion beam 125. The edges of the panels that define the aperture may be referred to as interior edges. In certain embodiments, the interior edges may be straight. Further, the aperture mechanisms may be configured such that the maximum spacing between the panels is 4 inches, while the minimum spacing allows the panels to touch.

Since it may be desirable to completely block the ion beam 125, the surfaces of the panels that come together (i.e. the interior edges) may have surface features such as grooves and ridges or a shiplap shape to allow a fully closed position without mechanical interference.

In certain embodiments, the horizontal actuator 305 and the vertical actuator 315 may be independently controlled such that the horizontal separation may vary independently of the vertical separation. In other embodiments, the horizontal actuator 305 and the vertical actuator 315 may be commonly controlled such that movement in the horizontal direction results in a corresponding movement in the vertical direction.

In certain embodiments, as shown in FIG. 1B, the first aperture mechanism 300 may be disposed in front of the second aperture mechanism 310 such that the ion beam 125 passes through the opening in the first aperture mechanism 300 before reaching the second aperture mechanism 310. In other embodiments, the order of the aperture mechanisms is reversed. The distance between the first aperture mechanism 300 and the second aperture mechanism 310, in the Z direction, may be between 0 and 1 inch, although other dimensions are also possible.

FIGS. 1A-1B show the first aperture mechanism 300 as being horizontally oriented and the second aperture mechanism 310 as being vertically oriented. In this way, the space defined between the four panels forms a rectangle or square, depending on the separation in each direction.

However, other configurations are possible. For example, each of the aperture mechanisms may be rotated 45° such that the cross section of the ion beam may be diamond shaped. In these embodiments, the aperture mechanisms are offset by 90° from one another. In other embodiments, the offset may be more or less than 90°.

Furthermore, while FIGS. 1A-1B show two aperture mechanisms, the disclosure of not limited to this embodiment. For example, four aperture mechanisms may be utilized, where each is offset by 45° from another aperture. This may be used for that the aperture defined by the eight panels forms an octagon.

Figure 2A:
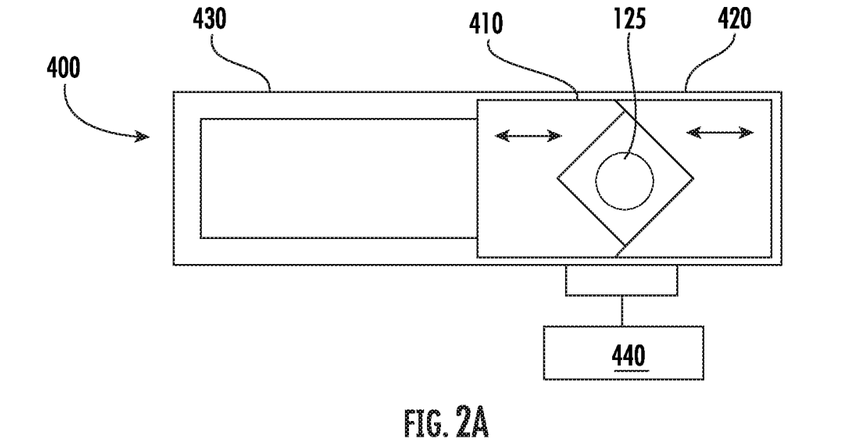
FIGS. 2A-2B show the aperture diaphragm according to a second embodiment.
Figure 2B:
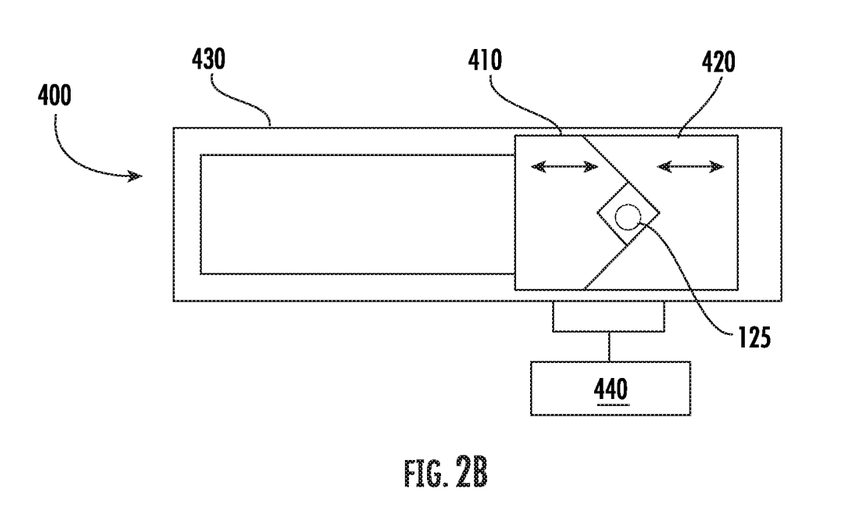

FIGS. 2A-2B show a second embodiment of an aperture diaphragm. In this embodiment, the aperture diaphragm comprises a single aperture mechanism 400. The aperture mechanism 400 comprises a first panel 410 and a second panel 420. The first panel 410 and the second panel 420 may be disposed on a guide system 430. The first panel 410 and the second panel 420 may be offset in the Z direction such that portions of one panel may overlap portions of the other panel. The first panel 410 and the second panel 420 may be in communication with an actuator 440. The actuator 440 may be configured to translate the first panel 410 and the second panel 420 in opposite directions at the same rate. In this way, the center of the space between the two panels remains fixed. The actuator 440 may be a stepper motor or another type of motor.

The panels may be constructed from graphite or another suitable material. The dimensions of the panels may be 2"×4", although other dimensions may also be used. The interior edges of the panels may each be V-shaped. More specifically, the interior edges may have an indent that comprises two sloped lines, one having a slope of 45° and the other having a slope of −45°. The two sloped lines meet at a 90° angle. The length of each sloped line on each panel is equal and may be between 1 and 2 inches, although larger beams may utilize larger features.

This configuration creates an aperture that is always a square. FIG. 2A shows the aperture mechanism in a first position, wherein the dual variable aperture is mostly open. Note that the panels form a square, that is rotated 45°, wherein each side of the square has a first dimension.

FIG. 2B shows the aperture mechanism in a second position, wherein the dual variable aperture is mostly closed. Note that the panels still form a square, that is rotated 45°, wherein each side of the square has a second dimension, smaller than the first dimension, while the center of the square remains in a fixed location. At each position between the first position and the second position, the aperture remains a square, with sides having a length between the first dimension and the second dimension.

In certain embodiments, the panels may be moved closer together such that the aperture is completely closed, if desired.

Furthermore, if desired, the aperture mechanism may be rotated 45° so that the aperture is a square that is not rotated.

Figure 3:
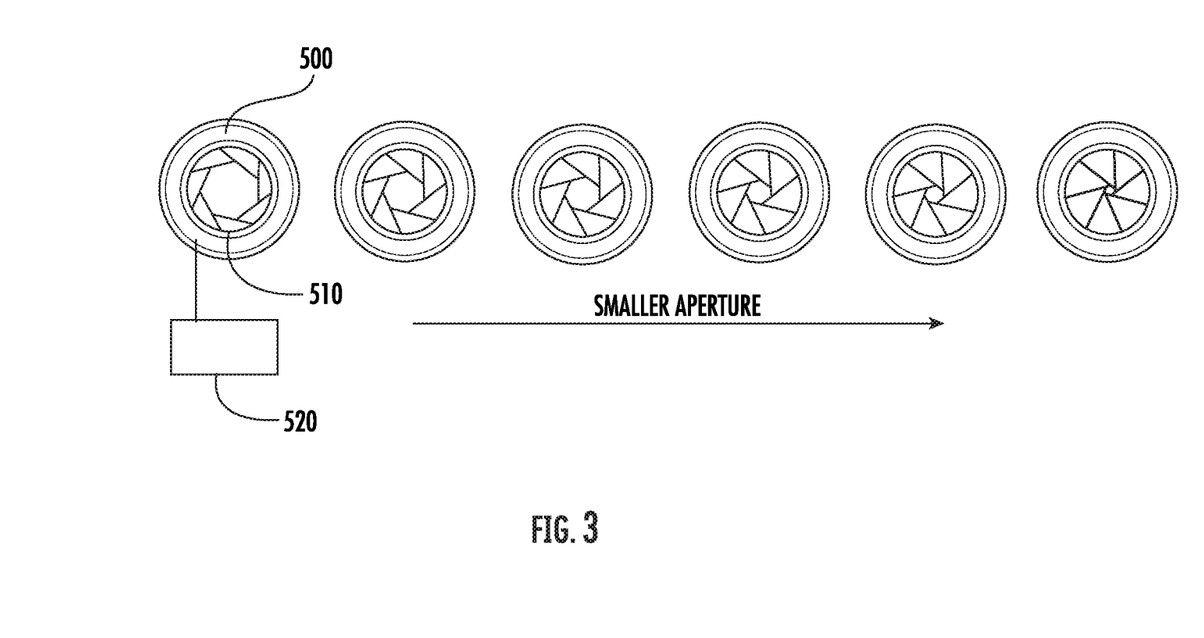
FIG. 3 shows the aperture diaphragm according to a third embodiment.

FIG. 3 show a third embodiment of an aperture diaphragm that may be used to create the dual variable aperture. In this embodiment, the aperture mechanism comprises an outer ring 500. Within the outer ring 500 are a plurality of blades 510. The blades 510 are configured to rotate inward as shown in the figure. An actuator 520 is used to rotate the blades 510. In the leftmost figure, the blades 510 are retracted such that the aperture is its largest. In the rightmost figure, the blades 510 have been rotated such that the aperture is at or near its minimum. This embodiment is similar to the iris diaphragm in a camera or other optical device.

The blades 510 may be made from graphite or another suitable material. The diameter of the outer ring 500 may be between 3 and 8 inches.

Of course, the previous figures show only some of the embodiments that may be used to create an aperture diaphragm. Other configurations may be used to create a dual variable aperture. The disclosure is not limited to only these embodiments.

The dual variable aperture may be utilized with various ion implantation systems.

Figure 4:
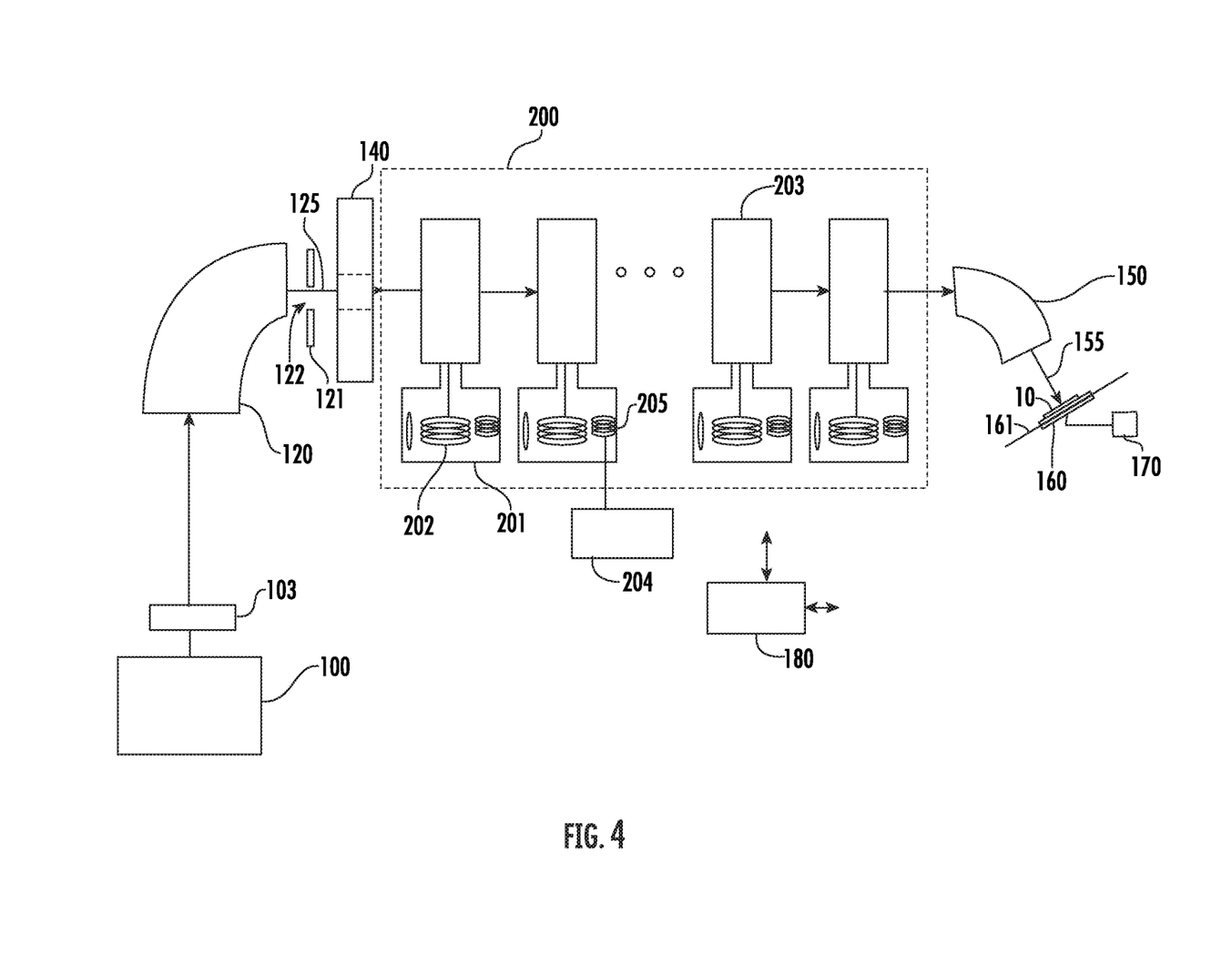
FIG. 4 shows a semiconductor processing apparatus that may incorporate the dual variable aperture according to one embodiment.

In FIG. 4, the ion implantation system comprises an ion source 100, which is used to generate an ion beam. The ion source 100 has an extraction aperture through which ions may be extracted. These ions may be extracted from the ion source 100 by applying a negative voltage to the extraction optics 103 disposed outside the ion source 100, proximate the extraction aperture. The extraction optics 103 may be pulsed so that ions exit at specific times. The group of ions that exits may be referred to as a bunch. In one embodiment, a plurality of bunched ions may be created.

Located downstream from the extraction optics 103 is a mass analyzer 120. The mass analyzer 120 uses magnetic fields to guide the path of the extracted ions. The magnetic fields affect the flight path of ions according to their mass to charge ratio. A mass resolving device 121 that has a resolving aperture 122 is disposed at the output, or distal end, of the mass analyzer 120. The output from the mass analyzer 120 may be an ion beam 125 that is a spot beam. A spot beam is an ion beam where the ions are travelling having a roughly circular cross-section.

By proper selection of the magnetic fields, only those ions that have a selected mass to charge ratio will be directed through the resolving aperture 122. Other ions will strike the mass resolving device 121 or a wall of the mass analyzer 120 and will not travel any further in the system.

The aperture diaphragm 140 may be disposed after the mass resolving device 121 in the beam path. The ion beam 125 enters the aperture diaphragm 140, where none, some or all of the ion beam 125 continues downstream.

Following the aperture diaphragm 140 is an acceleration column. In this embodiment, the acceleration column comprises a linear accelerator 200, also referred to as a Linac.

The linear accelerator 200 comprises one or more cavities 201. Each cavity 201 comprises a resonator coil 202 that may be energized by electromagnetic fields created by an excitation coil 205. The excitation coil 205 is disposed in the cavity 201 with a respective resonator coil 202. The excitation coil 205 is energized by an excitation voltage, which may be a RF signal. The excitation voltage may be supplied by a respective RF generator 204. In other words, the excitation voltage applied to each excitation coil 205 may be independent of the excitation voltage supplied to any other excitation coil 205. Each excitation voltage is preferably modulated at the resonance frequency of its respective cavity 201.

When an excitation voltage is applied to the excitation coil 205, a voltage is induced on the resonator coil 202. The result is that the resonator coil 202 in each cavity 201 is driven by a sinusoidal voltage. Each resonator coil 202 may be in electrical communication with a respective accelerator electrode 203. The ions pass through apertures in each accelerator electrode 203. In certain embodiments, the accelerator electrodes 203 may be ring-shaped.

The entry of the bunch into a particular accelerator electrode 203 is timed such that the potential of the accelerator electrode 203 is negative as the bunch approaches, but switches to positive as the bunch passes through the accelerator electrode 203. In this way, the bunch is accelerated as it enters the accelerator electrode 203 and is repelled as it exits. This results in an acceleration of the bunch. This process is repeated for each accelerator electrode 203 in the linear accelerator 200. Each accelerator electrode 203 increases the acceleration of the ions.

After the bunch exits the linear accelerator 200, the bunch may pass through a scanner 150, which serve to create the final ion beam 155 containing the desired species of ions. The scanner 150 causes the incoming ion beam to be fanned in the width direction so as to form a scanned ribbon ion beam.

The platen 160 may be in communication with a platen orientation motor 170. The platen orientation motor 170 may be configured to move the platen 160 in any of a plurality of different directions. For example, the platen orientation motor 170 may have the capability to rotate the platen 160.

Rotation occurs about an axis that is normal to the surface of the platen 160 and passes through the center of the workpiece (or platen). The angle of rotation may be referred to as the twist angle.

Additionally, the platen orientation motor 170 is configured to tilt the platen 160. Tilt is defined as a rotation about an axis 161 that is parallel to the wider dimension of the ion beam and passing through the center of the platen 160. This tilt is sometimes referred to as X-tilt. The angle of X-tilt may be referred to as the tilt angle.

Additionally, the ion implantation system includes a controller 180. The controller 180 may include a processing unit, such as a microcontroller, a personal computer, a special purpose controller, or another suitable processing unit. The controller 180 may also include a non-transitory computer readable storage element, such as a semiconductor memory, a magnetic memory, or another suitable memory. This non-transitory storage element may contain instructions and other data that allows the controller 180 to perform the functions described herein.

The controller 180 may be in communication with the RF generator 204, so as to control the implant energy. The controller 180 may be in communication with the aperture diaphragm 140 to control the size of the aperture. The controller 180 may also be in communication with other components.

Figure 5:
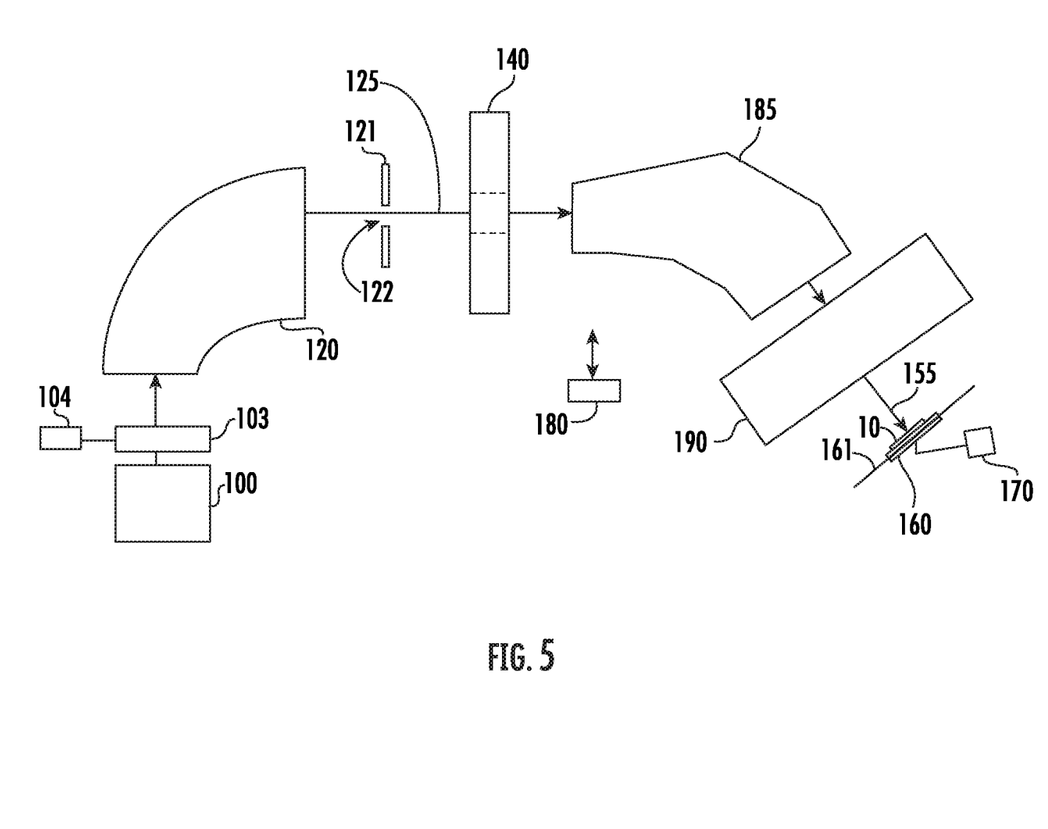
FIG. 5 shows a semiconductor processing apparatus that may incorporate the dual variable aperture according to a second embodiment.

A second embodiment is shown in FIG. 5. Components that are common with FIG. 4 are given identical reference designators.

The ion implantation system includes an ion source 100. In certain embodiments, the ion source 100 may be an RF ion source. In another embodiment, the ion source 100 may be an indirectly heated cathode (IHC). Other embodiments are also possible. For example, the plasma may be generated in a different manner, such as by a Bernas ion source, a capacitively coupled plasma (CCP) source, microwave or ECR (electron-cyclotron-resonance) ion source. The manner in which the ions is generated is not limited by this disclosure.

One chamber wall, referred to as the extraction plate, includes an extraction aperture. The extraction aperture may be an opening through which the ions generated in the ion source chamber are extracted and directed toward a workpiece 10. The extraction aperture may be any suitable shape. In certain embodiments, the extraction aperture may be round. In these embodiments, a spot ion beam is extracted from the ion source 100.

Disposed outside and proximate the extraction aperture of the ion source 100 are extraction optics 103. In certain embodiments, the extraction optics 103 comprises one or more electrodes. Each electrode may be a single electrically conductive component with an aperture disposed therein. Alternatively, each electrode may be comprised of two electrically conductive components that are spaced apart so as to create the aperture between the two components. The electrodes may be a metal, such as tungsten, molybdenum or titanium. One or more of the electrodes may be electrically connected to ground. In certain embodiments, one or more of the electrodes may be biased using an extraction power supply 104. The extraction power supply 104 may be used to bias one or more of the electrodes relative to the ion source 100 so as to attract ions through the extraction aperture. The voltage applied by the extraction power supply 104 to the extraction optics 103 may determine the energy of the extracted ions.

Located downstream from the extraction optics 103 is a mass analyzer 120. The mass analyzer 120 uses magnetic fields to guide the path of the extracted ions. The magnetic fields affect the flight path of ions according to their mass and charge. A mass resolving device 121 that has a resolving aperture 122 is disposed at the output, or distal end, of the mass analyzer 120. The output from the mass analyzer 120 may be an ion beam 125 that is a spot beam.

By proper selection of the magnetic fields, only those ions that have a selected mass and charge will be directed through the resolving aperture 122 as ion beam 125. Other ions will strike the mass resolving device 121 or a wall of the mass analyzer 120 and will not travel any further in the system.

The aperture diaphragm 140 is disposed downstream from the mass resolving device 121 and before the acceleration column.

A collimator 185 is disposed downstream from the mass resolving device 121. The collimator 185 accepts the ions that pass through the resolving aperture 122 as a spot beam and creates a ribbon ion beam formed of a plurality of parallel or nearly parallel beamlets.

Located downstream from the collimator 185 may be an acceleration/deceleration stage 190. The acceleration/deceleration stage 190 may be referred to as an energy purity module. The energy purity module is a beam-line lens component configured to independently control deflection, acceleration, deceleration, and focus of the ion beam. For example, the energy purity module may be a vertical electrostatic energy filter (VEEF) or electrostatic filter (EF).

In certain embodiments, quadrupole lenses may be disposed in certain positions in the ion implantation system. For example, a quadrupole lens may be disposed between the ion source 100 and the mass analyzer 120, between the mass analyzer 120 and the mass resolving device 121, and/or between the mass resolving device 121 and the collimator 185.

Of course, the ion implantation system may include other components, such as a scanner to create a ribbon beam from a spot ion beam, and additional electrodes to accelerate or decelerate the beam and other elements.

Thus, in this embodiment, the acceleration/deceleration stage 190 may be referred to as an acceleration column, as this component are used to accelerate the ions to the desired implant energy.

The final ion beam 155 exits the acceleration/deceleration stage 190 and impacts the workpiece 10 disposed on the platen 160. The platen 160 may be in communication with a platen orientation motor 170. The platen orientation motor 170 may be configured to move the platen 160 in any of a plurality of different directions. For example, the platen orientation motor 170 may have the capability to rotate the platen 160. Additionally, the platen orientation motor 170 is configured to tilt the platen 160. Tilt is defined as a rotation about an axis 161 that is parallel to the wider dimension of the ion beam and passing through the center of the platen 160. This tilt is sometimes referred to as X-tilt. The angle of X-tilt may be referred to as the tilt angle.

Additionally, the ion implantation system includes a controller 180. The controller 180 may include a processing unit, such as a microcontroller, a personal computer, a special purpose controller, or another suitable processing unit. The controller 180 may also include a non-transitory computer readable storage element, such as a semiconductor memory, a magnetic memory, or another suitable memory. This non-transitory storage element may contain instructions and other data that allows the controller 180 to perform the functions described herein.

The controller 180 may be in communication with the extraction power supply 104 and other components, so as to control the implant energy. The controller 180 may be in communication with the aperture diaphragm 140 to control the size of the aperture. In addition, the controller 180 may be in communication with other components.

Thus, FIGS. 4 and 5 both show an ion implantation system that includes an ion source 100, a mass analyzer 120, an aperture diaphragm 140, an acceleration column, a platen 160, and a controller 180. In each of these embodiments, the aperture diaphragm 140 is disposed downstream from the mass analyzer 120 and upstream from the acceleration column.

In certain embodiments, the aperture diaphragm 140 may be used in conjunction with the mass resolving device 121, as shown in FIGS. 4 and 5. However, in other embodiments, the aperture diaphragm may replace the mass resolving device 121 and perform its function. Rather, the aperture diaphragm 140 serves the function of the mass resolving device 121. In other words, the aperture diaphragm 140 is used to selectively allow ions of the desired mass/charge ratio to pass through the dual variable aperture. Other ions will strike the aperture diaphragm 140 or a wall of the mass analyzer 120 and will not travel any further in the system.

In other embodiments, as stated above and shown in FIGS. 4-5, the aperture diaphragm 140 is used in conjunction with the mass resolving device 121. When used with the mass resolving device 121, the aperture diaphragm 140 may also be used to perform a variety of different functions within these ion implantation systems.

For example, in FIG. 4, each accelerator electrode 203 may be a hollow ring having a certain inner diameter. For optimal operation of the linear accelerator 200, it may be advantageous that the ion beam 125 has a diameter that is smaller than the inner diameter of the accelerator electrode 203. In this way, the ion beam 125 passes through the hollow center of each accelerator electrode 203 without contacting them. Thus, in one embodiment, the aperture diaphragm 140 is used to restrict the cross-sectional area of the ion beam 125 such that the ion beam that exits the aperture diaphragm 140 is smaller than the inner diameter of the accelerator electrodes 203.

Thus, in this embodiment, the aperture diaphragm 140 is used to control the size and/or shape of the cross-sectional area of the ion beam that enters the acceleration column. Note that any of the embodiments shown in the previous figures may be used to perform this function. Thus, in certain embodiments, the controller 180 may control the aperture diaphragm 140 such that the dimension and/or shape of the cross-sectional area of the ion beam entering the acceleration column is properly configured.

In certain embodiments, it may advantageous to vary the beam current that strikes the workpiece. While this may be performed by reconfiguring the parameters of the ion source 100, this process may be time consuming. Thus, in another embodiment, the aperture diaphragm 140 is used to vary the beam current that enters the acceleration column. By changing the dual variable aperture, the cross-sectional area of the ion beam can be changed. The beam current is proportional to this cross-sectional area. Thus, if, for example, the cross-sectional area of the incoming ion beam is a circle having a diameter of 1 inch, the beam current may be reduced by 50% by reducing the aperture such that the ion beam exiting the dual variable aperture has a diameter of about 0.7 inches. Thus, the aperture diaphragm 140 may be used to vary the beam current. This applies to the ion implantation systems shown in FIGS. 4-5 and may be achieved using any of the aperture diaphragms described above.

In another embodiment, it may be beneficial to control the angular spread of the ion beam 125. For example, as the ion beam exits the mass analyzer 120, all of the ions are not travelling along the Z direction. In some embodiments, some of the ions may also have a velocity with an X-direction or Y-direction component. The mass resolving device 121 tends to remove ions that have an X-direction component that is greater than some predetermined limit. However, since the mass resolving device 121 only creates an aperture along the X direction, this device does not filter any ions with an excessive Y-direction component. Consequently, the mass resolving device 121 may help reduce angular spread along the X-direction (i.e. the width of the ion beam), but does not control the angular spread along the Y-direction (i.e. the height of the ion beam). Because the aperture diaphragm 140 controls the size of the aperture in two directions, the aperture diaphragm 140 may control angular spread in both the X and Y directions.

Furthermore, by incorporating a mass resolving device 121 and the aperture diaphragm 140 together, the angular spread in the X-direction may be very tightly controlled. Assume that the center of the horizontal aperture defined by the mass resolving device 121 and the center of the horizontal aperture defined by the aperture diaphragm 140 are aligned in the X direction. The resolving aperture 122 may have a horizontal aperture having a first dimension in the X direction. Likewise, the aperture diaphragm 140 has a horizontal aperture having a second dimension in the X direction. The difference between the first dimension and the second dimension, divided by the distance between their positions in the Z direction may be used to define the largest angle that may pass through both apertures.

Furthermore, if the mass resolving device 121 is replaced with an aperture diaphragm 140, such that there are two aperture diaphragms along the beam line, the angular spread in both directions may be more tightly controlled.

Thus, in certain embodiments, the controller 180 is in communication with the aperture diaphragm so as to control at least one parameter of the ion beam. That parameter may be angular spread in the width (i.e. X) direction, angular spread in the height (i.e. Y) direction, beam current, and cross-section area of the ion beam.

The aperture diaphragm described herein have many advantages. First, unlike a mass resolving device, the aperture diaphragm allows control of the cross-sectional area of the ion beam in two directions. This feature allows the aperture diaphragm to perform a variety of different functions. For example, the aperture diaphragm may be used to limit the beam current that impacts the workpiece. This approach allows changes in beam current to be affected much faster than can be done changing the parameters of the ion source. Second, the aperture diaphragm may be used to control the cross-sectional area of the ion beam so that the ion beam passes through the center of the accelerator electrodes in a linear accelerator. Further, the aperture diaphragm also provides the ability to control the angular spread of the ion beam in both the X and Y directions.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implantation system, comprising:
   an ion source to generate an ion beam;
   a mass analyzer;
   a mass resolving device, comprising a resolving aperture to allow only select ions to pass though the resolving aperture;
   an acceleration column to accelerate the ion beam toward a workpiece;
   a platen; and
   an aperture diaphragm, disposed between the mass resolving device and the acceleration column, wherein the aperture diaphragm is configured to vary a size of an aperture in two dimensions.

2. The ion implantation system of claim 1, wherein the acceleration column comprises a linear accelerator.

3. The ion implantation system of claim 1, wherein the acceleration column comprises an acceleration/deceleration stage, and the ion implantation system further comprises a collimator disposed upstream from the acceleration/deceleration stage.

4. The ion implantation system of claim 1, wherein the aperture diaphragm comprises two aperture mechanisms, wherein each aperture mechanism comprises two panels disposed on a guide rail, wherein the two panels are controlled by an actuator.

5. The ion implantation system of claim 4, wherein the two aperture mechanisms are offset by 90°.

6. The ion implantation system of claim 4, wherein the two aperture mechanisms are independently controlled.

7. The ion implantation system of claim 1, wherein the aperture diaphragm comprises an aperture mechanism, comprising two panels disposed on a guide rail, wherein an interior edge of each panel has an indent that comprises two sloped lines, wherein the two sloped lines meet at a 90° angle.

8. The ion implantation system of claim 1, wherein the aperture diaphragm comprises an iris aperture.

9. An ion implantation system, comprising:
   an ion source to generate an ion beam;
   a mass analyzer;
   an acceleration column to accelerate the ion beam toward a workpiece;
   a platen adapted to hold the workpiece;
   an aperture diaphragm, disposed between the mass analyzer and the acceleration column, wherein the aperture diaphragm is configured to change a size of an aperture in two dimensions; and
   a controller in communication with the aperture diaphragm to vary the size of the aperture so as to control at least one parameter of the ion beam, wherein the at least one parameter comprises angular spread in a width direction or angular spread in a height direction.

10. The ion implantation system of claim 9, wherein the aperture diaphragm functions as a mass resolving device and also controls a height of the ion beam.

11. An ion implantation system, comprising:
   an ion source to generate an ion beam;
   a mass analyzer;
   an acceleration column to accelerate the ion beam toward a workpiece;
   a platen adapted to hold the workpiece;
   an aperture diaphragm, disposed between the mass analyzer and the acceleration column, wherein the aperture diaphragm is configured to change a size of an aperture in two dimensions; and
   a controller in communication with the aperture diaphragm to vary the size of the aperture, wherein the acceleration column comprises a linear accelerator, and wherein the linear accelerator comprises a plurality of accelerator electrodes, wherein the accelerator electrodes are ring shaped, and the controller varies the size of the aperture such that a cross-sectional area of the ion beam exiting the aperture diaphragm is less than an inner diameter of the accelerator electrodes.

12. The ion implantation system of claim 9, wherein the controller varies the size of the aperture so as to change a beam current that impacts the workpiece disposed on the platen.

13. The ion implantation system of claim 9, further comprising a mass resolving device disposed between the mass analyzer and the aperture diaphragm.

14. The ion implantation system of claim 13, wherein the controller controls the size of the aperture to control the angular spread in the width direction, and wherein the angular spread is determined based on the size of the aperture, the size of an opening in the mass resolving device, and a distance between the aperture diaphragm and the mass resolving device in a direction of the ion beam.

15. The ion implantation system of claim 9, wherein the aperture diaphragm comprises two aperture mechanisms, wherein each aperture mechanism comprises two panels disposed on a guide rail, wherein the two panels are controlled by an actuator.

16. The ion implantation system of claim 9, wherein the controller controls the angular spread in the height direction independent of the angular spread in the width direction.

17. The ion implantation system of claim 9, further comprising a second aperture diaphragm, disposed between the mass analyzer and the aperture diaphragm, wherein the controller controls the apertures so as to control the angular spread in the height direction.

18. The ion implantation system of claim 9, wherein the aperture diaphragm comprises an aperture mechanism, comprising two panels disposed on a guide rail, wherein an interior edge of each panel has an indent that comprises two sloped lines, wherein the two sloped lines meet at a 90° angle.

19. The ion implantation system of claim 9, wherein the aperture diaphragm comprises an iris aperture.

* * * * *